(12) United States Patent
Fan et al.

(10) Patent No.: US 12,360,544 B2
(45) Date of Patent: Jul. 15, 2025

(54) VOLTAGE REGULATOR, POWER SUPPLY SYSTEM AND RECEIVER

(71) Applicants: Beijing ESWIN Computing Technology Co., Ltd., Beijing (CN); Hefei ESWIN Computing Technology Co., Ltd., Hefei (CN)

(72) Inventors: Hao Fan, Beijing (CN); Dongmyung Lee, Beijing (CN); Jangjin Nam, Beijing (CN); Donghoon Baek, Beijing (CN); Zhengbei Hua, Beijing (CN)

(73) Assignees: BEIJING ESWIN COMPUTING TECHNOLOGY CO., LTD., Beijing (CN); HEFEI ESWIN COMPUTING TECHNOLOGY CO., LTD., Anhui (CN)

( * ) Notice: Subject to any disclaimer, the term of this patent is extended or adjusted under 35 U.S.C. 154(b) by 348 days.

(21) Appl. No.: 18/145,510

(22) Filed: Dec. 22, 2022

(65) Prior Publication Data
US 2023/0244259 A1 Aug. 3, 2023

(30) Foreign Application Priority Data
Jan. 29, 2022 (CN) .......................... 202210111338.9

(51) Int. Cl.
*G05F 1/59* (2006.01)
*G05F 1/46* (2006.01)
(Continued)

(52) U.S. Cl.
CPC .............. *G05F 1/575* (2013.01); *G05F 1/462* (2013.01); *G05F 1/468* (2013.01); *G05F 1/59* (2013.01); *H03K 19/094* (2013.01)

(58) Field of Classification Search
CPC ........ G05K 1/575; G05K 1/462; G05K 1/468; G05K 1/59; H03K 19/094
See application file for complete search history.

(56) References Cited

U.S. PATENT DOCUMENTS 10,203,709 B1 2/2019 Feng et al.
11,157,029 B1 * 10/2021 Liu .......................... G05F 1/575
(Continued)

FOREIGN PATENT DOCUMENTS

CN 102981543 A 3/2013
CN 107977037 A 5/2018
(Continued)

OTHER PUBLICATIONS

Search Report dated Nov. 3, 2022 from Office Action for Chinese Application No. 202210111338.9 issued Nov. 10, 2022. 3 pgs.

*Primary Examiner* — Adolf D Berhane
(74) *Attorney, Agent, or Firm* — Ladas & Parry, LLP

(57) ABSTRACT

The voltage regulator comprises: a voltage regulation circuit, a detection circuit and at least one current source unit. An output terminal of the voltage regulation circuit is electrically connected to a first terminal of each of the current source units, and is configured to be electrically connected to a load; and a second terminal of each of the current source units is electrically connected to a first voltage terminal. The detection circuit is electrically connected to the voltage regulation circuit, and is configured to: when the voltage regulation circuit is in a light-load state, control a designed number of the current source units to connect to the output terminal of the voltage regulation circuit to output designed current, and when the voltage regulation circuit is in a heavy-load state, control each of the current source units to disconnect from the output terminal of the voltage regulation circuit.

17 Claims, 5 Drawing Sheets

(51) Int. Cl.
      *G05F 1/575*         (2006.01)
      *H03K 19/094*      (2006.01)

(56) References Cited

U.S. PATENT DOCUMENTS

| | | |
|---|---|---|
| 11,474,551 B1 | 10/2022 | Tan et al. |
| 2002/0130646 A1 | 9/2002 | Zadeh et al. |
| 2015/0015215 A1* | 1/2015 | Wu .................. H02P 9/107 |
| | | 322/28 |
| 2015/0349636 A1 | 12/2015 | Bodano et al. |
| 2018/0287479 A1 | 10/2018 | Li et al. |
| 2019/0294189 A1* | 9/2019 | Sakaguchi ............ G05F 1/565 |
| 2020/0117225 A1 | 4/2020 | Grabinski et al. |
| 2021/0257902 A1* | 8/2021 | Chang ................... H02M 1/32 |

FOREIGN PATENT DOCUMENTS

| | | |
|---|---|---|
| CN | 112327987 A | 2/2021 |
| CN | 113342106 A | 9/2021 |

* cited by examiner

VOLTAGE REGULATOR, POWER SUPPLY SYSTEM AND RECEIVER

CROSS-REFERENCING OF RELATED APPLICATIONS

This application claims priority to Chinese patent application 202210111338.9 filed with the State Intellectual Property Office on 29 Jan. 2022, the contents of which are incorporated herein by reference in their entirety.

TECHNICAL FIELD

The present disclosure relates to the technical field of voltage regulators, and in particular, to a voltage regulator, a power supply system and a receiver.

BACKGROUND

With the continuous development of green energy-saving and systems on chip (SoC), the power management inside the chip circuit has become a great challenge due to the continuous reduction of device size. For example, low-voltage power supply systems are very sensitive to ripple, noise, and coupling between chip layers.
In integrated circuit design, noise on the power supply voltage can reduce the overall noise margin of the transceiver and also reduce the phase noise of the oscillator, making the voltage regulator play an important role in analog/radio frequency, mixed-signals and digital module interfaces. However, existing voltage regulators have problems such as high power consumption or low stability.

SUMMARY

In view of the shortcomings of the existing methods, the present disclosure provides a voltage regulator and a control method thereof, a power supply system, a receiver and a control method thereof, so as to solve the technical problems of high power consumption or low stability of the voltage regulator in the prior art.

In a first aspect, an embodiment of the present disclosure provides a voltage regulator, including: a voltage regulation circuit, a detection circuit, and at least one current source unit;
 an output terminal of the voltage regulation circuit is electrically connected to a first terminal of each of the current source units, and is configured to be electrically connected to a load; and a second terminal of each of the current source units is electrically connected to a first voltage terminal; and
 the detection circuit is electrically connected to the voltage regulation circuit, and is configured to: when the voltage regulation circuit is in a light-load state, control a designed number of the current source units to connect to the output terminal of the voltage regulation circuit to output designed current, and when the voltage regulation circuit is in a heavy-load state, control each of the current source units to disconnect from the output terminal of the voltage regulation circuit.

Alternatively, the voltage regulation circuit includes a first switch module and the detection circuit includes a second switch module;
 a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and
 a first terminal of the second switch module is electrically connected to a third voltage terminal, and a second terminal of the second switch module is used for outputting a detection voltage.

Alternatively, the voltage regulation circuit further includes a first resistor and a second resistor connected in series, and the detection circuit includes a third resistor;
 a first terminal of the first resistor is electrically connected to a second terminal of the first switch module, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal; and
 a first terminal of the third resistor is electrically connected to a second terminal of the second switch module, a second terminal of the third resistor is electrically connected to a fifth voltage terminal, and the voltage of the fifth voltage terminal is less than the voltage of the third voltage terminal.

Alternatively, the detection circuit includes a control unit;
 a first terminal of the control unit is electrically connected to a second terminal of the second switch module; a second terminal of the control unit is configured to obtain a reference voltage; and a third terminal of the control unit is configured to be electrically connected to the current source unit; and
 the control unit is configured to: compare the reference voltage with the detection voltage, if the detection voltage is less than the reference voltage, control a designed number of the current source units to connect to the output terminal of the voltage regulation circuit to output designed current, and if the detection voltage is greater than the reference voltage, control each of the current source units to disconnect from the output terminal of the voltage regulation circuit.

Alternatively, the control unit includes a first comparator;
 a first input terminal, a second input terminal and an output terminal of the first comparator are respectively used as the first terminal, the second terminal and the third terminal of the control unit; and
 the first comparator is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit to connect to or disconnect from an output terminal of the voltage regulation circuit.

Alternatively, the voltage regulator includes one current source unit;
 the current source unit includes a constant current source and a control switch;
 a first terminal of the control switch is electrically connected to an output terminal of the voltage regulation circuit, a second terminal of the control switch is electrically connected to a first terminal of the constant current source, and a control terminal of the control switch is electrically connected to an output terminal of the first comparator; and a second terminal of the constant current source is electrically connected to the first voltage terminal; and the designed current is constant current generated by the constant current source.

Alternatively, the control unit includes a second comparator and a logic module, and the voltage regulator includes at least two current source units;
  a first input terminal and a second input terminal of the second comparator are respectively used as the first terminal and the second terminal of the control unit;
  an output terminal of the second comparator is electrically connected to an input terminal of the logic module to compare the reference voltage and the detection voltage to output a comparison result to the logic module;
  an output terminal of the logic module is used as the third terminal of the control unit, and is configured to be electrically connected to each of the current source units;
  a first terminal of each of the current source units is electrically connected to an output terminal of the voltage regulation circuit, and a second terminal of each of the current source units is electrically connected to the first voltage terminal; and
  the logic module is configured to output a control signal according to the comparison result to control each of the current source units to connect to or disconnect from an output terminal of the voltage regulation circuit.

Alternatively, the control unit further includes a selection module;
  an output terminal of the selection module is electrically connected to a second input terminal of the second comparator;
  the selection module includes at least two input terminals, and the input terminal of each of the selection modules is respectively electrically connected to a designed reference voltage terminal; the voltage of each of the designed reference voltage terminals is a corresponding designed reference voltage;
  the selection module is configured to sequentially output each of the designed reference voltages from the output terminal of the selection module in the descending order of the designed reference voltages; and
  the second comparator is configured to: compare the reference voltage with any of the designed reference voltages output by the output terminal of the selection module, the designed reference voltage being used as the reference voltage; if the detection voltage is less than the detection voltage, output a first comparison signal; and if the detection voltage is greater than the detection voltage, output a second comparison signal; and the comparison result includes all comparison signals output by the second comparator.

Alternatively, the logic module includes at least two output terminals, and the output terminal of each of the logic modules is electrically connected to one of the current source units to correspondingly control the current source unit to connect to or disconnect from the output terminal of the voltage regulation circuit; and
  the logic module is configured to control an output terminal of each of the logic modules to output a first control signal or a second control signal according to the comparison result, to correspondingly control a current source unit to connect to or disconnect from the output terminal of the voltage regulation circuit; and the control signal includes a first control signal or a second control signal output by an output terminal of each of the logic modules.

Alternatively, constant current output by each of the current source units is 1 to $2^N$ times the reference current in sequence, where N≥1 and N is a positive integer; and the designed current is the sum of constant current generated by the current source unit connected to the output terminal of the voltage regulation circuit.

In a second aspect, an embodiment of the present disclosure provides a power supply system, including the voltage regulator described in the first aspect. wherein the voltage regulator comprising a voltage regulation circuit, a detection circuit and at least one current source unit;
  an output terminal of the voltage regulation circuit is electrically connected to a first terminal of each of the current source units, and is configured to be electrically connected to a load; and a second terminal of each of the current source units is electrically connected to a first voltage terminal; and
  the detection circuit is electrically connected to the voltage regulation circuit, and is configured to: when the voltage regulation circuit is in a light-load state, control a designed number of the current source units to connect to the output terminal of the voltage regulation circuit to output designed current, and when the voltage regulation circuit is in a heavy-load state, control each of the current source units to disconnect from the output terminal of the voltage regulation circuit.

Alternatively, the voltage regulation circuit comprises a first switch module, and the detection circuit comprises a second switch module;
  a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and
  a first terminal of the second switch module is electrically connected to a third voltage terminal, and a second terminal of the second switch module is used for outputting a detection voltage.

Alternatively, the voltage regulation circuit further comprises a first resistor and a second resistor connected in series, and the detection circuit comprises a third resistor;
  a first terminal of the first resistor is electrically connected to a second terminal of the first switch module, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal; and
  a first terminal of the third resistor is electrically connected to a second terminal of the second switch module, a second terminal of the third resistor is electrically connected to a fifth voltage terminal, and the voltage of the fifth voltage terminal is less than a voltage of the third voltage terminal.

Alternatively, the detection circuit comprises a control unit;
  a first terminal of the control unit is electrically connected to a second terminal of the second switch module; a second terminal of the control unit is configured to obtain a reference voltage; and a third terminal of the control unit is configured to be electrically connected to the current source unit; and the control unit is configured to: compare the reference voltage with the detection voltage, if the detection voltage is less than the reference voltage, control a designed number of the current source units to connect to the output terminal of the voltage regulation circuit to output designed current, and if the detection voltage is greater than the reference voltage, control each of the current source units to disconnect from the output terminal of the voltage regulation circuit.

Alternatively, the control unit comprises a first comparator;

a first input terminal, a second input terminal and an output terminal of the first comparator are respectively used as the first terminal, the second terminal and the third terminal of the control unit; and the first comparator is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit to connect to or disconnect from an output terminal of the voltage regulation circuit.

In a third aspect, an embodiment of the present disclosure provides a receiver, including: a clock & data recovery circuit and the voltage regulator described in the first aspect, wherein the voltage regulation circuit comprises a first switch module, and the detection circuit comprises a second switch module;

a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and a first terminal of the second switch module is electrically connected to a third voltage terminal, and a second terminal of the second switch module is used for outputting a detection voltage.

Alternatively, the voltage regulation circuit comprises a first switch module, and the detection circuit comprises a second switch module;

a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and a first terminal of the second switch module is electrically connected to a third voltage terminal, and a second terminal of the second switch module is used for outputting a detection voltage.

Alternatively, the voltage regulation circuit further comprises a first resistor and a second resistor connected in series, and the detection circuit comprises a third resistor;

a first terminal of the first resistor is electrically connected to a second terminal of the first switch module, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal; and a first terminal of the third resistor is electrically connected to a second terminal of the second switch module, a second terminal of the third resistor is electrically connected to a fifth voltage terminal, and the voltage of the fifth voltage terminal is less than a voltage of the third voltage terminal.

Alternatively, the detection circuit comprises a control unit;

a first terminal of the control unit is electrically connected to a second terminal of the second switch module; a second terminal of the control unit is configured to obtain a reference voltage; and a third terminal of the control unit is configured to be electrically connected to the current source unit; and the control unit is configured to: compare the reference voltage with the detection voltage, if the detection voltage is less than the reference voltage, control a designed number of the current source units to connect to the output terminal of the voltage regulation circuit to output designed current, and if the detection voltage is greater than the reference voltage, control each of the current source units to disconnect from the output terminal of the voltage regulation circuit.

Alternatively, the control unit comprises a first comparator;

a first input terminal, a second input terminal and an output terminal of the first comparator are respectively used as the first terminal, the second terminal and the third terminal of the control unit; and the first comparator is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit to connect to or disconnect from an output terminal of the voltage regulation circuit Additional aspects and advantages of the present disclosure will be given in the following description, some of which will become apparent from the following description or appreciated by implementing the present disclosure.

BRIEF DESCRIPTION OF THE DRAWINGS

The above and/or additional aspects and advantages of the present disclosure will become apparent and be readily understood from the following description of embodiments with reference to the accompanying drawings, in which.

DETAILED DESCRIPTION

Figure 1:
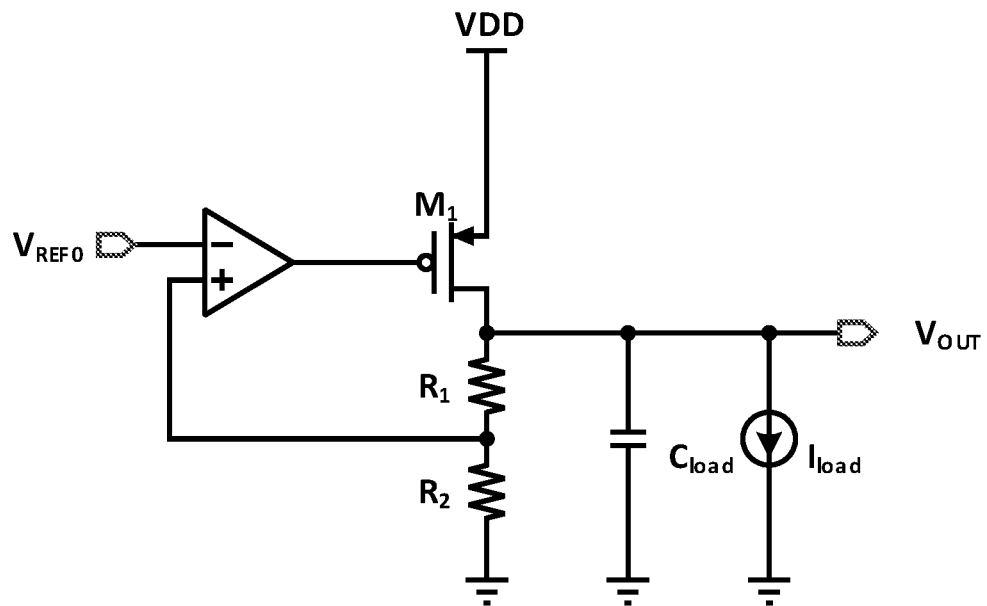
FIG. 1 is a schematic structure diagram of an existing LDO (Low Dropout Regulator) circuit.

Examples of embodiments of the present disclosure will be illustrated below in the drawings throughout which same or similar reference numerals refer to same or similar elements or elements having same or similar functions. Also, detailed descriptions of known technologies will be omitted if they are not necessary for the illustrated features of the present disclosure. The embodiments described with reference to the drawings are illustrative, merely used for explaining the present disclosure and should not be regarded as any limitations thereto.

It may be understood by those skilled in the art that, unless otherwise defined, all terms (including technical and scientific terms) used herein have the same meaning as commonly understood by a person of ordinary skill in the art to which the present disclosure belongs. It should also be understood that terms, such as those defined in a general dictionary, should be understood to have meanings consistent with their meanings in the context of the prior art and, unless specifically defined as herein, should not be interpreted in idealistic or overly formal meaning.

It should be understood by a person of ordinary skill in the art that singular forms "a", "an", "the", and "said" may be intended to include plural forms as well, unless otherwise stated. It should be further understood that terms "include/including" used in this specification specify the presence of the stated features, integers, steps, operations, elements and/or components, but not exclusive of the presence or addition of one or more other features, integers, steps, operations, elements, components, and/or combinations thereof. It should be understood that when a component is referred to as being "connected to" or "coupled to" another component, it may be directly connected or coupled to other elements or provided with intervening elements therebetween. In addition, "connected to" or "coupled to" as used herein may include wireless connection or coupling. As used herein, term "and/or" includes all or any of one or more associated listed items or combinations thereof.

It was found that, with the continuous development of green energy-saving and systems on chip (SoC), the power management inside the chip circuit has become a great challenge due to the continuous reduction of device size. For example, low-voltage power supply systems are very sensitive to ripple, noise, and coupling between chip layers.

In integrated circuit design, noise on the power supply voltage can reduce the overall noise margin of the transceiver and also reduce the phase noise of the oscillator, making the voltage regulator play an important role in analog/radio frequency, mixed-signals and digital module interfaces. However, existing voltage regulators have problems such as high power consumption or low stability.

Figure 2:
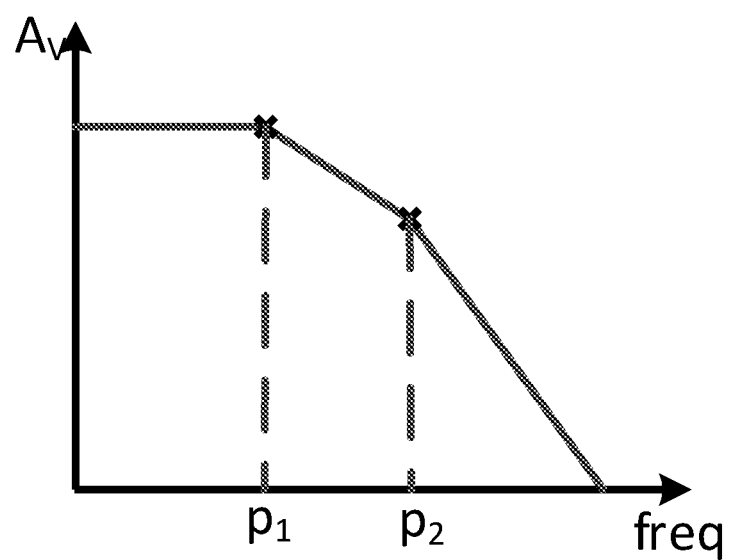
FIG. 2 is an amplitude-frequency response curve diagram of the LDO circuit of FIG. 1.

At present, LDOs with high power supply rejection ratio can protect voltage-sensitive analog circuits from power supply noise. Taking LDOs as an example, the circuit principle of the voltage regulator will be explained. Referring to FIG. 1 and FIG. 2, FIG. 1 shows a conventional PRSS LDO circuit, and FIG. 2 shows an amplitude-frequency response curve of the LDO circuit of FIG. 1, where Av represents the voltage amplification factor and freq represents the frequency. $V_{REF0}$ is the reference voltage of the LDO, which is from the bandgap reference. The output voltage $V_{OUT}$ is equal to $V_{REF0}*(R_1+R_2)/R_2$. The LDO circuit has at least two important poles: a pole p1 at the gate of the output MOS transistor (i.e., M1) and a pole p2 at the output terminal (i.e., the output terminal for the output voltage $V_{OUT}$). For an LDO without external capacitors, the pole p1 at the gate of the output MOS transistor (M1) is the main pole, and the output pole p2 is the secondary pole. When $I_{load}$ decreases, the frequency of p2 will move toward the low frequency. When $I_{load}$ is close to 0, the frequency of p2 is close to the frequency of p1. Stability will be an important issue. The frequency of p2 needs to be far away from the frequency of p1 to ensure the stability of the LDO.

Figure 3:
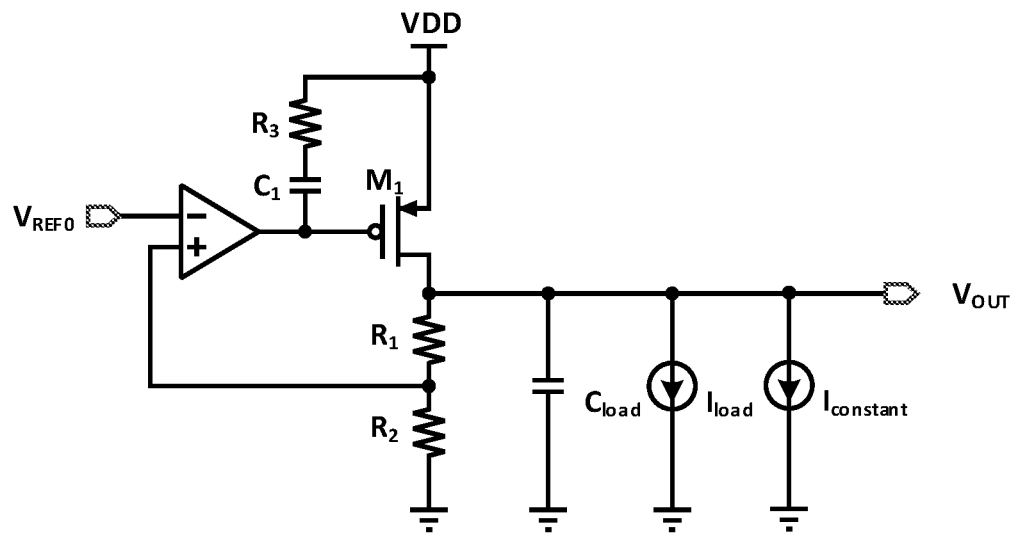
FIG. 3 is a schematic structure diagram of another existing LDO circuit.
Figure 4:
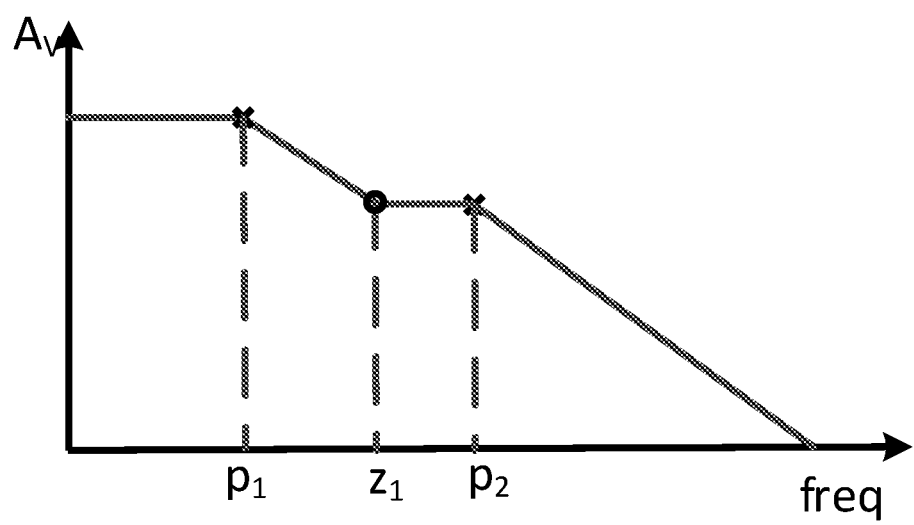
FIG. 4 is an amplitude-frequency response curve diagram of the LDO circuit of FIG. 3.

It was further found that, in order to get better stability, Miller compensation may be used. A constant current source is added at the output voltage $V_{OUT}$. Referring to FIG. 3 and FIG. 4, FIG. 3 shows another LDO circuit, and FIG. 4 shows an amplitude-frequency response curve of the LDO circuit of FIG. 3, where p1, p2 and z1 are used to analyze the frequency response characteristics of the circuit, not specific points in the circuit. A constant current source $I_{constant}$ is added, so that the frequency of p2 is far away from the frequency of p1 when the LDO operates in a light-load state. Miller compensation is used (that is, the structure of $R_3$ and $C_1$ being connected in series is added) to generate a zero point z1 to improve the stability. However, this structure has two disadvantages. When $I_{load}$ increases and the LDO operates in a heavy-load state, the frequency of p2 is far from the frequency of p1 even if no $I_{constant}$ is added. This constant current source will increase the power consumption of the LDO in the heavy-load state. Thus, the PSRR (Power Supply Rejection Ratio) performance is decreased.

The voltage regulator and the control method thereof, the power supply system, the receiver and the control method thereof provided by the present disclosure aim to solve the above technical problems in the prior art.

The technical solutions of the present disclosure and how to solve the above technical problems by the technical solutions of the present disclosure will be described below by specific embodiments in detail.

Figure 5:
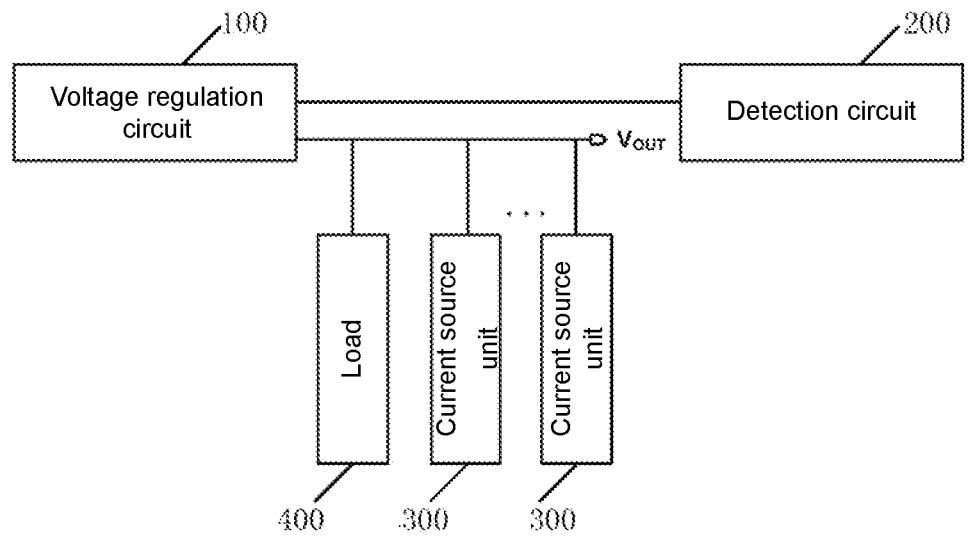
FIG. 5 is a schematic structure diagram of a voltage regulator according to an embodiment of the present disclosure.

An embodiment of the present disclosure provides a voltage regulator. As shown in FIG. 5, the voltage regulator includes a voltage regulation circuit 100, a detection circuit 200 and at least one current source unit 300.

An output terminal of the voltage regulation circuit 100 is electrically connected to a first terminal of each of the current source units 300, and is configured to be electrically connected to a load; and a second terminal of each of the current source units 300 is electrically connected to a first voltage terminal.

The detection circuit 200 is electrically connected to the voltage regulation circuit 100, and is configured to: when the voltage regulation circuit 100 is in a light-load state, control a designed number of the current source units 300 to connect to the output terminal of the voltage regulation circuit 100 to output designed current, and when the voltage regulation circuit 100 is in a heavy-load state, control each of the current source units 300 to disconnect from the output terminal of the voltage regulation circuit 100.

The voltage regulator in the embodiment of the present disclosure is provided with a detection circuit 200 and at least one current source unit 300. Each current source unit 300 can be controlled to connect to or disconnect from the output terminal of the voltage regulation circuit 100 according to whether the voltage regulator operates in a light-load or heavy-load state. In this way, the performance of the voltage regulator is optimized. When the voltage regulation circuit 100 is in a light-load state, a designed number of the current source units 300 are controlled to connect to the output terminal of the voltage regulation circuit 100 to output designed current. In this way, when the voltage regulator operates in a light-load state, better stability can be obtained. When the voltage regulation circuit 100 is in a heavy-load state, each current source unit 300 is controlled to disconnect from the output terminal of the voltage regulation circuit 100. In this way, the power consumption can be reduced and the PSRR performance can be improved.

In the embodiments of the present disclosure, determination can be made to whether the voltage regulator operates in a light-load or heavy-load state, and the performance of the voltage regulator can be optimized according to different loads and control settings. In this way, the stability of the voltage regulator is improved and the power consumption of the voltage regulator is reduced. Thus, the PSRR performance is improved.

Optionally, as shown in FIG. 5, the voltage regulation circuit 100 is configured to supply a voltage to the load 400 when the voltage at the output terminal of the voltage regulation circuit 100 is the output voltage $V_{OUT}$. The connection of the current source unit 300 to the output terminal of the voltage regulation circuit 100 can keep the pole p2 away from the pole p1 when the voltage regulator operates in a light-load state. The stability of the voltage regulator is improved. When the voltage regulation circuit 100 is in a heavy-load state, the pole p2 is also far away from the pole p1, which can meet the requirements of the voltage regulator for the pole p2 to be far away from the pole p1. Each current source unit 300 is controlled to disconnect from the output terminal of the voltage regulation circuit 100. That is, the current source unit 300 is not connected to the voltage regulation circuit 100. Thus, no power consumption is generated and the PSRR performance is improved.

Optionally, a designed number of current source units 300 are controlled to connect to the output terminal of the voltage regulation circuit 100. That is, at least one current source unit 300 of all current source units 300 is controlled to connect to the output terminal of the voltage regulation circuit 100.

Optionally, the voltage regulator may be an LDO, and the voltage regulation circuit 100 adopts the circuit structure of the LDO.

Optionally, when the current source unit 300 is connected to the output terminal of the voltage regulation circuit 100, it can output constant current. The current source unit 300 has two states: OFF and ON. In the ON state, the current source unit 300 is connected to the output terminal of the voltage regulation circuit 100, and it correspondingly outputs set constant current. When the current source unit 300 is disconnected from the output terminal of the voltage regulation circuit 100, the current source unit 300 is in the OFF state in which it does not operate.

Optionally, the first voltage terminal is grounded, and the voltage is 0.

Optionally, whether the voltage regulation circuit 100 is in a light-load or heavy-load state is related to the connected load 400. The load 400 may vary with the operating frequency of the circuit itself, or may vary with the load 400 connected to the voltage regulation circuit 100. The light-load state and the heavy-load state of the voltage regulation circuit 100 are respectively the first operating state and the second operating state of the voltage regulation circuit 100.

It was considered by the inventor(s) of the present disclosure that load current may be used to determine whether the voltage regulation circuit 100 is in a light-load or heavy-load state. The load current $I_{load}$ corresponds to the total current $I_{total}$ of the voltage regulation circuit 100. The detection circuit 200 may simulate the total current $I_{total}$ for current detection. That is, the detection circuit 200 is a current detection circuit which can detect the load current of the voltage regulator. Meanwhile, the detection current may correspond to the detection voltage. The detection circuit 200 may determine the voltage. Then, the current source unit 300 may be controlled to connect to or disconnect from the output terminal of the voltage regulation circuit 100 according to the determination on whether the voltage regulation circuit 100 is in a light-load or heavy-load state.

Figure 6:
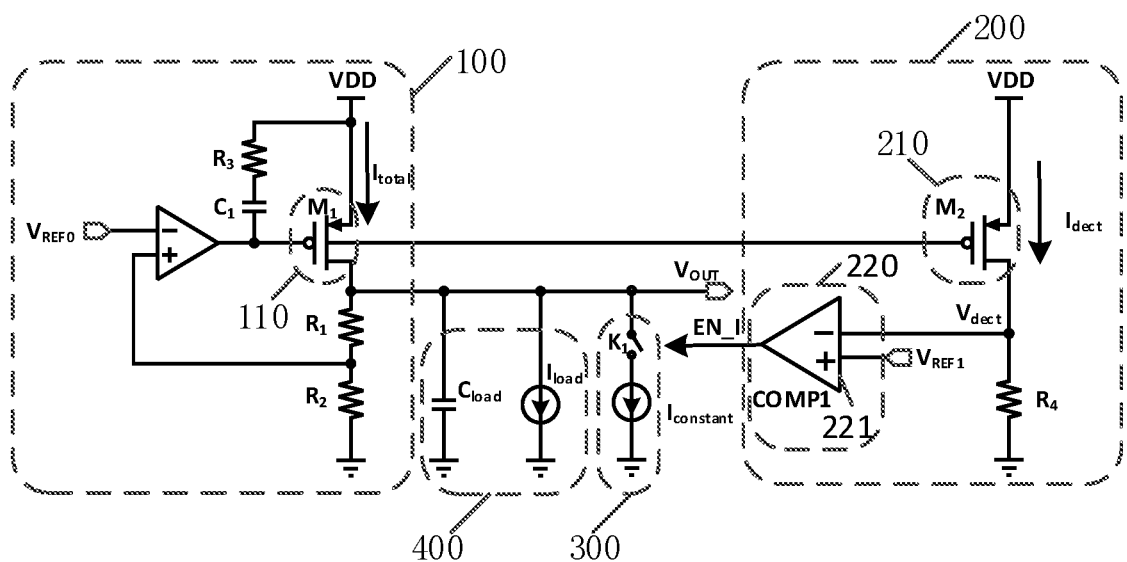
FIG. 6 is a schematic structure diagram of the circuit of another voltage regulator according to an embodiment of the present disclosure.

Referring to FIG. 6, the total current $I_{total}$ includes the load current $I_{load}$ and the designed current. $I_{total}$ is the sum of $I_{load}$ and $I_{constant}$. When each current source unit 300 is disconnected from the output terminal of the voltage regulation circuit 100, the total current $I_{total}$ does not include the designed current. The load current $I_{load}$ may be known from the total current $I_{total}$. The detection circuit 200 may copy the total current $I_{total}$ to the detection current $I_{dect}$. Because the total current $I_{total}$ cannot directly act on the resistance, which will affect the normal operation of the voltage regulator, the detection circuit 200 may adopt the same circuit structure to obtain the detection current $I_{dect}$ corresponding to the total current $I_{total}$ and then use the detection current on the resistance for detection.

The embodiment of the present disclosure provides an effective voltage regulator under different load current $I_{load}$, power supply voltage (i.e., $V_{out}$) and control settings. The power consumption can be reduced, and the stability and the PSRR performance can be improved.

Figure 7:
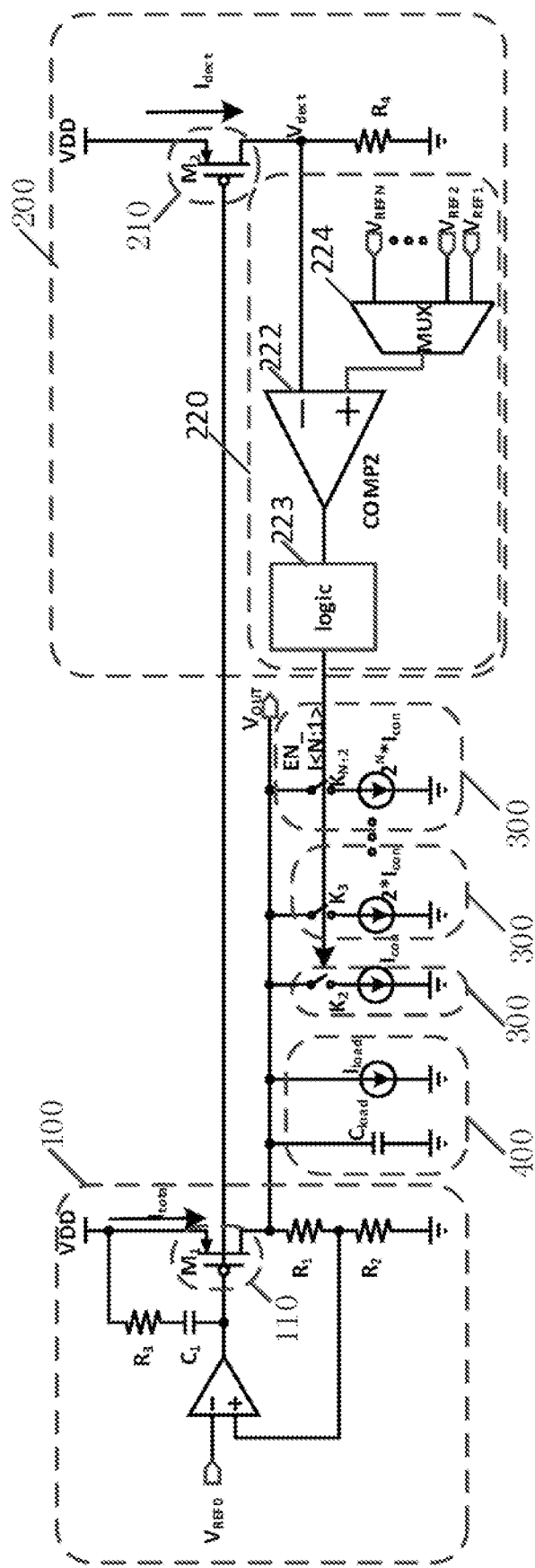
FIG. 7 is a schematic structure diagram of the circuit of still another voltage regulator according to an embodiment of the present disclosure.

Based on the above analysis, in some embodiments, as shown in FIG. 6 and FIG. 7, the voltage regulation circuit 100 includes a first switch module 110, and the detection circuit 200 includes a second switch module 210.

A first terminal of the first switch module 110 is electrically connected to a second voltage terminal, a second terminal of the first switch module 110 is electrically connected to the output terminal of the voltage regulation circuit 100, and a control terminal of the first switch module 110 is electrically connected to a control terminal of the second switch module 210.

A first terminal of the second switch module 210 is electrically connected to a third voltage terminal, and a second terminal of the second switch module 210 is used for outputting a detection voltage.

Optionally, as shown in FIG. 6 and FIG. 7, the second voltage terminal and the third voltage terminal are both connected to a VDD voltage terminal. The structures of the first switch module 110 and the second switch module 210 are corresponding to each other. The first switch module 110 includes a switch device M1, and the second switch module 210 includes a switch device M2. The gate, source and drain of the switch device M1 are used as the control terminal, the first terminal and the second terminal of the first switch module 110, respectively. The gate, source and drain of the switch device M2 are used as the control terminal, the first terminal and the second terminal of the second switch module 210, respectively. The switch device M1 and the switch device M2 are the same. The detection circuit 200 equivalently stimulates the current of the voltage regulation circuit 100. The total current $I_{total}$ corresponds to the detection current $I_{dect}$ which can reflect the total current $I_{total}$. The detection current $I_{dect}$ may be equal to the total current $I_{total}$.

Equivalently, the detection circuit 200 copies the circuit of the voltage regulation circuit 100 to obtain the total current $I_{total}$. The detection current $I_{total}$ may be proportional to the total current $I_{total}$, to reflect the magnitude of the total current $I_{total}$. By correspondingly converting the detection current $I_{total}$ of the second switch module 210 into the detection voltage $V_{dect}$ of the second terminal of the second switch module 210, the current is detected.

In some embodiments, the voltage regulation circuit 100 further includes a first resistor and a second resistor connected in series, and the detection circuit 200 includes a third resistor.

A first terminal of the first resistor is electrically connected to a second terminal of the first switch module 110, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal.

A first terminal of the third resistor is electrically connected to a second terminal of the second switch module 210, a second terminal of the third resistor is electrically connected to a fifth voltage terminal, and the voltage of the fifth voltage terminal is less than the voltage of the third voltage terminal.

Optionally, as shown in FIG. 6 and FIGS. 7, R1 and R2 represent the first resistor and the second resistor, respectively, and R4 represents the third resistor. The fourth voltage terminal and the fifth voltage terminal are both grounded, and the voltage is 0. The first switch module 110 and the second switch module 210 have the same structure, the switch device M1 and the switch device M2 are the same, the current $I_{dect}$ is equal to the current $I_{total}$, and the voltage at the second terminal of the first switch module 110 is the same as the detection voltage $V_{dect}$. The detection voltage $V_{dect}$ may be used to determine whether the voltage regulation circuit 100 is in a light-load or heavy-load state.

Optionally, since the resistances of the first resistor R1 and the second resistor R2 are known, and the currents on the first resistor R1 and the second resistor R2 are known, subtracting the current on the first resistor R1 and the second resistor R2 from the total current $I_{total}$ makes the load current $I_{load}$ or the sum of the load current $I_{load}$ and the designed current. The total current $I_{total}$ may reflect the load current $I_{load}$. Detecting the total current $I_{total}$ is equivalent to detecting the load current $I_{load}$.

Optionally, as shown in FIG. 6 and FIG. 7, $C_{load}$ represents the load capacitance of the load 400, and $I_{load}$ represents the load current of the load 400. $C_{load}$ and $I_{load}$ are electrically connected to the output terminal of the voltage regulation circuit 100 equivalently connecting to the load 400.

Optionally, the voltage regulation circuit 100 further includes a fourth resistor and a first capacitor connected in series, the first terminal of the fourth resistor is electrically connected to the second voltage terminal, the second terminal of the fourth resistor is connected to the first terminal of the first capacitor, and the second terminal of the first capacitor is electrically connected to the control terminal of the first switch module 110.

Optionally, the voltage regulation circuit 100 further includes a third comparator, the first input terminal of the third comparator receives a reference voltage, the second input terminal of the third comparator is electrically connected to the second terminal of the first resistor and the first terminal of the second resistor, and the output terminal of the third comparator is electrically connected to the control terminal of the first switch module 110.

Optionally, as shown in FIG. 6 and FIG. 7, R3 represents the fourth resistor, C1 represents the first capacitor, the switch device M1 is used as the first switch module 110, and $V_{REF0}$ represents the reference voltage. $V_{REF0}$ is the reference voltage of the LDO, which comes from the bandgap reference. What is obtained at the second input terminal of the third comparator is the voltage at the electrical connection between the second terminal of the first resistor and the first terminal of the second resistor, and the voltage here is also $V_{REF0}$. The output terminal of the third comparator also outputs $V_{REF0}$ In this way, the voltage regulation circuit 100 can operate stably.

In some embodiments, as shown in FIG. 6 and FIG. 7, the detection circuit 200 includes a control unit 220.

A first terminal of the control unit 220 is electrically connected to a second terminal of the second switch module 210; a second terminal of the control unit 220 is configured to obtain a reference voltage; and a third terminal of the control unit 220 is configured to be electrically connected to the current source unit 300.

The control unit 220 is configured to: compare the reference voltage with the detection voltage, if the detection voltage is less than the reference voltage, control a designed number of the current source units 300 to connect to the output terminal of the voltage regulation circuit 100 to output designed current, and if the detection voltage is greater than the reference voltage, control each of the current source units 300 to disconnect from the output terminal of the voltage regulation circuit 100.

In some embodiments, as shown in FIG. 6, the control unit 220 includes a first comparator 221.

A first input terminal, a second input terminal and an output terminal of the first comparator 221 are respectively used as the first terminal, the second terminal and the third terminal of the control unit 220.

The first comparator 221 is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit 300 to connect to or disconnect from an output terminal of the voltage regulation circuit 100.

Optionally, as shown in FIG. 6, COMP1 represents the first comparator 221, EN_I is the comparison signal output by the first comparator 221, $V_{REF1}$ represents the reference voltage, and $V_{REF1}$ comes from the bandgap reference.

Optionally, as shown in FIG. 6, the detection current $I_{dect}$ is equal to $A2/A1*I_{total}$, so that the detection voltage $V_{dect}$ is equal to $A2/A1*I_{total}*R4$. The first comparator 221 is used to compare $V_{dect}$ and $V_{REF1}$. A1 is the number of switch devices M1 included in the first switch module 110, and A2 is the number of switch devices M2 included in the second switch module 210. The proportional relationship between the total current $I_{total}$ and the detection current $I_{dect}$ may be adjusted by adjusting the number of switch devices M1 and the number of switch devices M2.

Optionally, the switch device M1 and the switch device M2 are the same switch devices. In this way, it is convenient to adjust the proportional relationship between the total current $I_{total}$ and the detection current $I_{dect}$ by directly adjusting the number of switch devices, so as to ensure the accuracy of the copied current.

In some embodiments, as shown in FIG. 6, the voltage regulator includes a current source unit 300.

The current source unit 300 includes a constant current source and a control switch.

A first terminal of the control switch is electrically connected to an output terminal of the voltage regulation circuit 100, a second terminal of the control switch is electrically connected to a first terminal of the constant current source, and a control terminal of the control switch is electrically connected to an output terminal of the first comparator 221.

A second terminal of the constant current source is electrically connected to the first voltage terminal; and the designed current is constant current generated by the constant current source.

Optionally, as shown in FIG. 6, $I_{constant}$ represents a constant current source that outputs constant current, and $K_1$ represents a control switch. The control switch $K_1$ is turned off, the constant current source $I_{constant}$ is disconnected from the output terminal of the voltage regulation circuit 100, and the current source unit 300 is disconnected from the output terminal of the voltage regulation circuit 100. The control switch $K_1$ is turned on, the constant current source $I_{constant}$ is connected to the output terminal of the voltage regulation circuit 100, and the current source unit 300 is connected to the output terminal of the voltage regulation circuit 100 to output the designed current. EN_I is output to the control terminal of the control switch $K_1$, so that the control switch $K_1$ is turned on or off.

Optionally, as shown in FIG. 6, when the voltage regulation circuit 100 operates in a light-load state, $V_{dect}<V_{REF1}$. Then, EN_I=1, the control switch $K_1$ is turned on, the constant current source $I_{constant}$ is connected to the output terminal of the voltage regulation circuit 100, the constant current source $I_{constant}$ is turned on to output constant current. EN_I=1 is the first comparison signal. When the voltage regulation circuit 100 operates in a heavy-load state, $V_{dect}>V_{REF1}$. Then, EN_I=0, the control switch $K_1$ is turned off, the constant current source $I_{constant}$ is disconnected from the output terminal of the voltage regulation circuit 100, and the constant current source $I_{constant}$ is turned off. EN_I=0 is the second comparison signal.

The voltage regulator of the embodiment of the present disclosure may be an LDO. When the LDO operates in a light-load state, better stability can be obtained. When the LDO operates in a heavy-load state, the power consumption can be reduced and the PSRR performance can be improved.

In some embodiments, as shown in FIG. 7, the control unit 220 includes a second comparator 222 and a logic module 223, and the voltage regulator includes at least two current source units 300.

A first input terminal and a second input terminal of the second comparator 222 are respectively used as the first terminal and the second terminal of the control unit 220.

An output terminal of the second comparator 222 is electrically connected to an input terminal of the logic module 223 to compare the reference voltage and the detection voltage to output a comparison result to the logic module 223.

An output terminal of the logic module 223 is used as the third terminal of the control unit 220, and is configured to be electrically connected to each of the current source units 300.

A first terminal of each of the current source units 300 is electrically connected to an output terminal of the voltage regulation circuit 100, and a second terminal of each of the current source units 300 is electrically connected to the first voltage terminal.

The logic module 223 is configured to output a control signal according to the comparison result to control each of the current source units 300 to connect to or disconnect from an output terminal of the voltage regulation circuit 100.

In some embodiments, as shown in FIG. 7, the control unit 220 includes a selection module 224.

An output terminal of the selection module 224 is electrically connected to a second input terminal of the second comparator 222.

The selection module 224 includes at least two input terminals, and the input terminal of each of the selection modules 224 is respectively electrically connected to a designed reference voltage terminal; the voltage of each of the designed reference voltage terminals is a corresponding designed reference voltage.

The selection module 224 is configured to sequentially output each of the designed reference voltages from the output terminal of the selection module 224 in the descending order of the designed reference voltages.

The second comparator 222 is configured to: compare the reference voltage with any of the designed reference voltages output by the output terminal of the selection module 224, the designed reference voltage being used as the reference voltage; if the detection voltage is less than the detection voltage, output a first comparison signal; and if the detection voltage is greater than the detection voltage, output a second comparison signal; and the comparison result includes all comparison signals output by the second comparator 222.

Optionally, as shown in FIG. 7, logic represents the logic module 223, which is a logic circuit; MUX represents the selection module 224, COMP2 represents the second comparator 222, and the designed reference voltages at each input terminal of the MUX from low to high are respectively: $V_{REF1}, V_{REF2} \ldots V_{REFN}$.

In some embodiments, as shown in FIG. 7, the logic module 223 includes at least two output terminals, and the output terminal of each of the logic modules 223 is electrically connected to one of the current source units 300 to correspondingly control the current source unit 300 to connect to or disconnect from the output terminal of the voltage regulation circuit 100.

The logic module 223 is configured to control an output terminal of each of the logic modules 223 to output a first control signal or a second control signal according to the comparison result, to correspondingly control a current source unit 300 to connect to or disconnect from the output terminal of the voltage regulation circuit 300; and the control signal includes a first control signal or a second control signal output by an output terminal of each of the logic modules 223.

Optionally, as shown in FIG. 7, EN-I<N:1> represents a control signal, including N+1 first control signals or second control signals corresponding to each current source unit 300 respectively. According to the first control signal or the second control signal, each current source unit 300 is controlled to connect to or disconnect from the output terminal of the voltage regulation circuit 100. The logic module 223 pre-stores various control signals to be output correspondingly to the comparison results.

In some embodiments, constant current output by each of the current source units 300 is 1 to $2^N$ times the reference current in sequence, where $N \geq 1$ and N is a positive integer; and the designed current is the sum of constant current generated by the current source unit 300 connected to the output terminal of the voltage regulation circuit 100.

Optionally, as shown in FIG. 7, each current source unit 300 includes a constant current source and a control switch. A first terminal of the control switch is electrically connected to an output terminal of the voltage regulation circuit 100, a second terminal of the control switch is electrically connected to a first terminal of the constant current source, and a control terminal of the control switch is electrically connected to an output terminal of the first comparator 221. The second terminal of the constant current source is electrically connected to the first voltage terminal.

Referring to FIG. 7, $I_{con}$, $2*I_{con}$ ... $2N*I_{con}$ represent constant current sources of one current source unit 300, respectively, which can output constant current of $I_{con}$, $2*I_{con}$, $2N*I_{con}$ respectively, that is, the designed reference voltage. When all current source units 300 are connected to the output terminal of the voltage regulation circuit 100, the designed current is the sum of constant current output by all the current source units 300. $K_2$, $K_3$ ... $K_{N+2}$ are control switches for the constant current sources $I_{con}$, $2*I_{con}$ ... $2N*I_{con}$, respectively.

Optionally, as shown in FIG. 7, the on and off principles of the control switches $K_2$, $K_3$ ... $K_{N+2}$ are the same as the on and off principles of the control switch $K_1$, which will not be repeated here.

Optionally, as shown in FIG. 7, for load current $I_{load}$ of different magnitudes, the current of each constant current source is correspondingly designed, for example, the constant current of $I_{con}$, $2*I_{con}$ ... $2N*I_{con}$. The voltages of $V_{REF1}$ to $V_{REFN}$ at the input terminal of the MUX come from the bandgap reference, and the voltages gradually increase. $V_{dect}$ and $V_{REF1}$ are compared in the T1 period, $V_{dect}$ and $V_{REF2}$ are compared in the T2 period, until $V_{dect}$ and $V_{REFN}$ are compared in the TN period according to the descending order of the designed reference voltages. Through the comparison of these periods, the detailed values of $I_{dect}$ are obtained so as to obtain the detailed values of the total current $I_{total}$ and the load current Load. The logic circuit logic is used to store the settings of EN_I<N:1>, and pre-store a set EN_I<N:1> control signals for the outputs corresponding to various comparison results. In this way, the designed current to be output can be finely adjusted.

Optionally, as shown in FIG. 7, as an example, when $V_{dect}$ is between $V_{REFN-1}$ and $V_{REFN}$, $V_{REF1}$ to $V_{REFN}$ are compared with $V_{dect}$ in turn. If $V_{dect}$ is greater than all voltage values except $V_{REFN}$ and is less than $V_{REFN}$, a control signal is output, so that the constant current source $I_{con}$ is turned on and the rest of the constant current sources $I_{con}$ are all turned off. That is, the control signal EN_I received by the control switch $K_2$ is 1. EN_I=1 is used as the first control signal. The control switch $K_2$ is turned on. The control signal EN_I received by the other control switches $K_2$ is 0, and the other control switches $K_2$ are turned off. All signals EN_I=1 or EN_I=0 form control signals of a set EN_I<N:1> to be output by the logic circuit logic.

Based on the same inventive concept, an embodiment of the present disclosure provides a power supply system, including the voltage regulator described in any embodiment of the present disclosure.

The power supply system provided by the embodiment of the present disclosure has the same inventive concept and the same beneficial effects as the voltage regulator of the foregoing embodiments. For the content not shown in detail in the power supply system, reference may be made to the foregoing embodiments, which will not be repeated here.

Based on the same inventive concept, an embodiment of the present disclosure provides a receiver, including: a clock & data recovery circuit and the voltage regulator described in any embodiment of the present disclosure.

Optionally, the voltage regulator in the embodiment of the present disclosure may also be applied to a transmitter.

The receiver provided by the embodiment of the present disclosure has the same inventive concept and the same beneficial effects as the voltage regulator of the foregoing embodiments. For the content not shown in detail in the receiver, reference may be made to the foregoing embodiments, which will not be repeated here.

Based on the same inventive concept, an embodiment of the present disclosure provides a method for controlling a voltage regulator, which is applied to the voltage regulator described in any embodiment of the present disclosure, including:

when the voltage regulation circuit 100 is in a light-load state, controlling a designed number of the current source units 300 to connect to the output terminal of the voltage regulation circuit 100 to output designed current; and when the voltage regulation circuit 100 is in a heavy-load state, controlling each of the current source units 300 to disconnect from the output terminal of the voltage regulation circuit 100.

Figure 8:
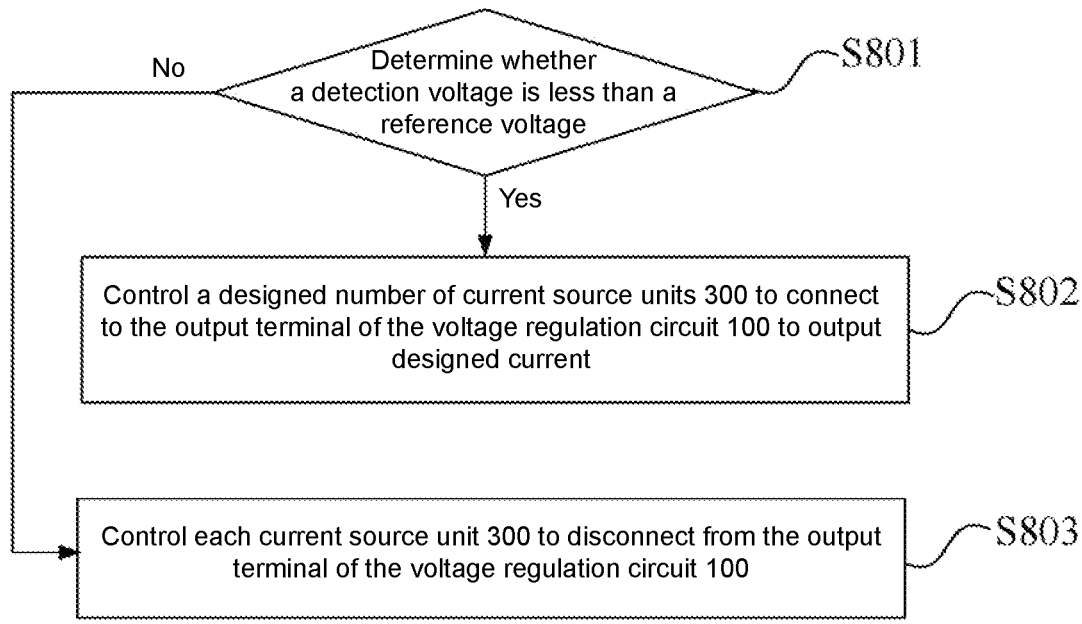
FIG. 8 is a flowchart of a method for controlling a voltage regulator according to an embodiment of the present disclosure.

Optionally, as an example, an embodiment of the present disclosure provides a method for controlling a voltage regulator. As shown in FIG. 8, the method for controlling a voltage regulator includes steps S801 to S803.

S801: It is determined that whether the detection voltage is less than the reference voltage, if so, the method goes to S802, and if not, it goes to S803.

Optionally, the control unit 220 determines whether the detection voltage is less than the reference voltage.

S802: A designed number of current source units 300 are controlled to connect to the output terminal of the voltage regulation circuit 100 to output designed current.

Optionally, the control unit 220 controls a designed number of current source units 300 to connect to the output terminal of the voltage regulation circuit 100 to output designed current.

S803: Each current source unit 300 is controlled to disconnect from the output terminal of the voltage regulation circuit 100.

Optionally, the control unit 220 controls each current source unit 300 to disconnect from the output terminal of the voltage regulation circuit 100.

Optionally, the method for controlling a voltage regulator includes the following steps.

The first comparator 221 compares the reference voltage with the detection voltage, if the detection voltage is less than the reference voltage, outputs a first comparison signal, and if the detection voltage is greater than the reference voltage, outputs a second comparison signal; and the first comparison signal and the second comparison signal are respectively used to control the current source unit 300 to connect to or disconnect from an output terminal of the voltage regulation circuit 100.

Optionally, the method for controlling a voltage regulator includes the following steps:

the second comparator 222 compares the reference voltage with the detection voltage, and outputs the comparison result to the logic module 223; and the logic module 223 outputs a control signal according to the comparison result to control each of the current source units 300 to connect to or disconnect from the output terminal of the voltage regulation circuit 100.

Optionally, the step of comparing the reference voltage with the detection voltage and outputting the comparison result to the logic module 223 by the second comparator 222 includes:

the selection module 224 sequentially outputs each of the designed reference voltages from the output terminal of the selection module 224 in the descending order of the designed reference voltages.

The second comparator 222 compares the reference voltage with any of the designed reference voltages output by the output terminal of the selection module 224, the designed reference voltage being used as the reference voltage; if the detection voltage is less than the detection voltage, outputs a first comparison signal; and if the detection voltage is greater than the detection voltage, outputs a second comparison signal; and the comparison result includes all comparison signals output by the second comparator 222.

It was considered by the inventor(s) of the present disclosure that, in the whole system, it is unknown whether the power supply voltage of the receiver has been stable. If the detection circuit 200 is used for current detection immediately after the system is powered on, there is no guarantee that a correct detection result can be obtained. In order to solve this problem, in the embodiment of the present disclosure, it is needed to start the current detection operation after the frequency of the clock & data recovery circuit of the receiver system is locked (i.e., in the first clock training phase).

Based on the above analysis, an embodiment of the present disclosure provides a method for controlling a receiver, which is applied to the receiver described in any embodiment of the present disclosure, including:

locking the operating frequency of the clock & data recovery circuit, the operating frequency being consistent with the operating frequency of a transmitter; and controlling a detection circuit 200 to perform current detection on a voltage regulator, and executing the method for controlling the voltage regulator described in any embodiment of the present disclosure.

In some embodiments, after controlling a detection circuit 200 to perform current detection on a voltage regulator, the method further includes:

controlling the detection circuit 200 to stop operating, locking the phase of the clock & data recovery circuit, and receiving transmission data from the transmitter by the receiver; and unlocking the phase of the clock & data recovery circuit, and relocking the operating frequency of the clock & data recovery circuit.

Figure 9:
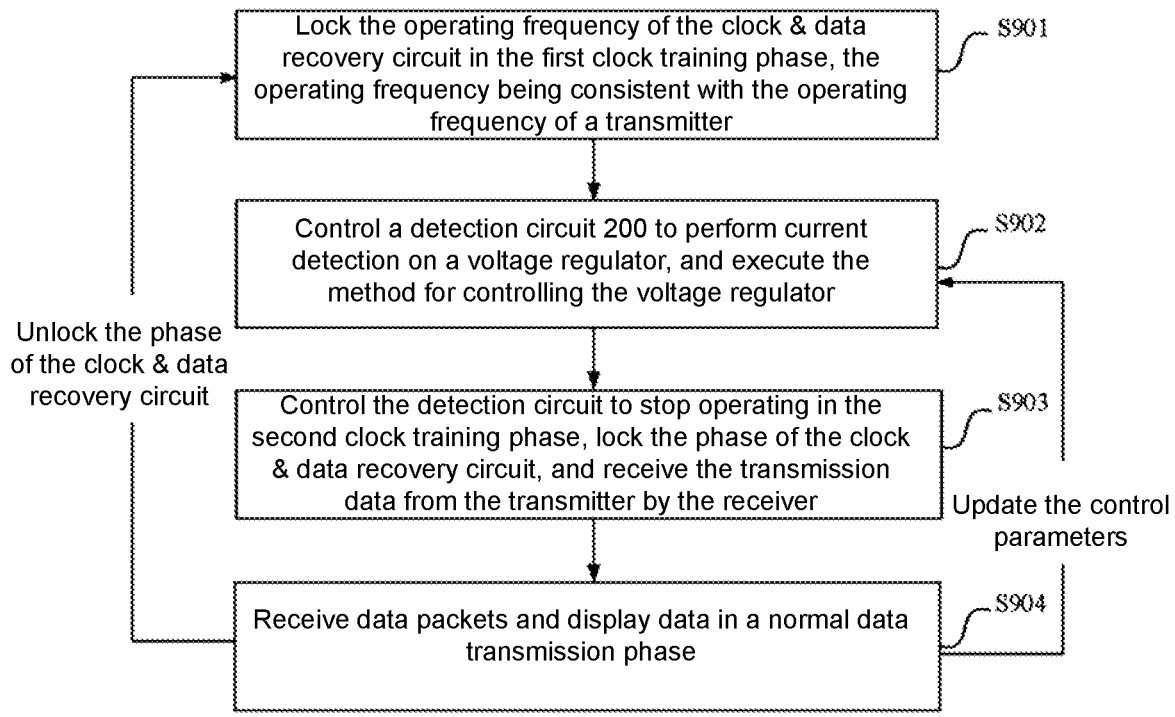
FIG. 9 is a flowchart of a method for controlling a receiver according to an embodiment of the present disclosure.

Optionally, as shown in FIG. 9, as an example, the method for controlling a receiver includes the following steps.

S901: The operating frequency of the clock & data recovery circuit is locked in the first clock training phase, the operating frequency being consistent with the operating frequency of a transmitter.

Optionally, it is powered on or restarted before the first clock training phase.

Optionally, after the operating frequency of the clock & data recovery circuit is locked, it means that the transmitter and receiver systems are stable, and the operating frequency of the voltage regulator is stable. The operating frequency of the clock & data recovery circuit is locked in the first clock training phase.

S902: A detection circuit 200 is controlled to perform current detection on a voltage regulator, and the method for controlling the voltage regulator is executed.

Optionally, after the detection circuit 200 is controlled to perform current detection on a voltage regulator and the method for controlling the voltage regulator described in any embodiment of the present disclosure is executed, it goes to the second clock training phase. That is, the detection circuit 200 is turned on to perform current detection between the first clock training phase and the second clock training phase.

S903: The detection circuit is controlled to stop operating in the second clock training phase, the phase of the clock & data recovery circuit is locked, and transmission data from the transmitter is received by the receiver.

Optionally, the system goes to the second clock training phase, the phase of the clock & data recovery circuit is locked the system operates normally, the detection circuit 200 is turned off, and the detection circuit 200 does not operate.

S904: Data packets and display data are received in the normal data transmission phase; if the phase of the clock & data recovery circuit is unlocked, S901 is executed again to relock the operating frequency of the clock & data recovery circuit; and if the control parameters of the system are updated, S902 is executed again.

Optionally, after the clock & data recovery circuit is locked, if the clock & data recovery circuit is unlocked due to a high bit error rate and abnormal frequency drift, the current detection will be performed again after the frequency of the clock & data recovery circuit is locked again.

Optionally, after the control parameters are updated, the operating state of the detection circuit 200 will change, the load 400 will change, and the current detection needs to be performed again. The detection circuit 200 will operate again, that is, the detection circuit 200 can also be adaptively adjusted.

The technical solutions in the embodiments of the present application have the following beneficial effects.

The voltage regulator in the embodiment of the present application is provided with a detection circuit and at least one current source unit. Each current source unit can be controlled to connect to or disconnect from the output terminal of the voltage regulation circuit according to whether the voltage regulator operates in a light-load or heavy-load state. In this way, the performance of the voltage regulator is optimized. When the voltage regulation circuit is in a light-load state, a designed number of the current source units are controlled to connect to the output terminal of the voltage regulation circuit to output designed current. In this way, when the voltage regulator operates in a light-load state, better stability can be obtained. When the voltage regulation circuit is in a heavy-load state, each current source unit is controlled to disconnect from the output terminal of the voltage regulation circuit. In this way, the power consumption can be reduced and the PSRR performance can be improved. In the embodiments of the present application, determination can be made to whether the voltage regulator operates in a light-load or heavy-load state, and the performance of the voltage regulator can be optimized according to different loads and control settings of the voltage regulator. In this way, the stability of the voltage regulator is improved and the power consumption of the voltage regulator is reduced. Thus, the PSRR performance is improved.

It may be understood by a person of ordinary skill in the art that the operations, methods, steps in the flows, measures and solutions already discussed in the present disclosure may be alternated, changed, combined or deleted. Further, the operations, methods, other steps in the flows, measures and solutions already discussed in the present disclosure may also be alternated, changed, rearranged, decomposed, combined or deleted. Further, prior arts having the operations, methods, the steps in the flows, measures and solutions already discussed in the present disclosure may also be alternated, changed, rearranged, decomposed, combined or deleted.

The terms "first" and "second" are simply used for the purpose of description, and should not be regarded as indicating or implying relative importance or implicitly indicating the number of indicated technical features. Therefore, the features defined as "first" and "second" may explicitly or implicitly include one or more of the features. In the description of the present disclosure, unless specifically stated otherwise, "a plurality of" means "two" or "more than two".

In the description, the specific features, structures, materials, or characteristics may be combined in a proper manner in any one or more embodiments or examples.

It should be understood that although the steps in the flowchart shown in the drawings are sequentially displayed by following the arrows, these steps are not necessarily performed in the order indicated by the arrows. Unless explicitly stated herein, the execution order of these steps is not strictly limited, and they can be performed in other orders. Moreover, at least some of the steps in the flowcharts shown in the drawings may include multiple sub-steps or multiple stages. These sub-steps or stages are not necessarily performed at the same moment of time, and instead, may be performed at different moments of time. The sub-steps or stages are not necessarily performed sequentially, and instead, may be performed in turn or alternately with other steps or at least some of the sub-steps or stages of other steps.

The foregoing descriptions are merely some implementations of the present disclosure. It should be noted that, to a person of ordinary skill in the art, various improvements and modifications may be made without departing from the principle of the present disclosure, and these improvements and modifications shall be deemed as falling into the protection scope of the present disclosure.

REFERENCE NUMERALS

100: voltage regulation circuit, 110: first switch module;
200: detection circuit, 210: second switch module, 220: control unit, 221: first comparator, 222: second comparator, 223: logic module, 224: selection module;
300: current source unit;
400: load.

What is claimed is:

1. A voltage regulator, comprising: a voltage regulation circuit, a detection circuit and at least one current source unit;
   an output terminal of the voltage regulation circuit is electrically connected to a first terminal of each of the current source units, and is configured to be electrically connected to a load; and a second terminal of each of the current source units is electrically connected to a first voltage terminal; and
   the detection circuit is electrically connected to the voltage regulation circuit, and is configured to: when the voltage regulation circuit is in a light-load state, control a designed number of the current source units to connect to the output terminal of the voltage regulation circuit to output designed current, and when the voltage regulation circuit is in a heavy-load state, control each of the current source units to disconnect from the output terminal of the voltage regulation circuit,
   wherein the voltage regulation circuit comprises a first switch module, and the detection circuit comprises a second switch module;
   a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and
   a first terminal of the second switch module is electrically connected to a third voltage terminal, and a second terminal of the second switch module is used for outputting a detection voltage.

2. The voltage regulator according to claim 1, wherein the voltage regulation circuit further comprises a first resistor and a second resistor connected in series, and the detection circuit comprises a third resistor;
   a first terminal of the first resistor is electrically connected to a second terminal of the first switch module, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal; and
   a first terminal of the third resistor is electrically connected to a second terminal of the second switch module, a second terminal of the third resistor is electrically connected to a fifth voltage terminal, and the voltage of the fifth voltage terminal is less than a voltage of the third voltage terminal.

3. The voltage regulator according to claim 1, wherein the detection circuit comprises a control unit;
   a first terminal of the control unit is electrically connected to a second terminal of the second switch module; a second terminal of the control unit is configured to obtain a reference voltage; and a third terminal of the control unit is configured to be electrically connected to the current source unit; and
   the control unit is configured to: compare the reference voltage with the detection voltage, if the detection voltage is less than the reference voltage, control a designed number of the current source units to connect to the output terminal of the voltage regulation circuit to output designed current, and if the detection voltage is greater than the reference voltage, control each of the current source units to disconnect from the output terminal of the voltage regulation circuit.

4. The voltage regulator according to claim 3, wherein the control unit comprises a first comparator;
   a first input terminal, a second input terminal and an output terminal of the first comparator are respectively used as the first terminal, the second terminal and the third terminal of the control unit; and
   the first comparator is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit to connect to or disconnect from an output terminal of the voltage regulation circuit.

5. The voltage regulator according to claim 4, wherein the voltage regulator comprises one current source unit;
   the current source unit comprises a constant current source and a control switch;
   a first terminal of the control switch is electrically connected to an output terminal of the voltage regulation circuit, a second terminal of the control switch is electrically connected to a first terminal of the constant current source, and a control terminal of the control switch is electrically connected to an output terminal of the first comparator; and
   a second terminal of the constant current source is electrically connected to the first voltage terminal; and the designed current is constant current generated by the constant current source.

6. The voltage regulator according to claim 3, wherein the control unit comprises a second comparator and a logic module, and the voltage regulator comprises at least two current source units;
   a first input terminal and a second input terminal of the second comparator are respectively used as the first terminal and the second terminal of the control unit;
   an output terminal of the second comparator is electrically connected to an input terminal of the logic module to compare the reference voltage and the detection voltage to output a comparison result to the logic module;
   an output terminal of the logic module is used as the third terminal of the control unit, and is configured to be electrically connected to each of the current source units;
   a first terminal of each of the current source units is electrically connected to an output terminal of the voltage regulation circuit, and a second terminal of each of the current source units is electrically connected to the first voltage terminal; and
   the logic module is configured to output a control signal according to the comparison result to control each of the current source units to connect to or disconnect from an output terminal of the voltage regulation circuit.

7. The voltage regulator according to claim 6, wherein the control unit further comprises a selection module;
   an output terminal of the selection module is electrically connected to a second input terminal of the second comparator;
   the selection module comprises at least two input terminals, and the input terminal of each of the selection modules is respectively electrically connected to a designed reference voltage terminal; the voltage of each of the designed reference voltage terminals is a corresponding designed reference voltage;
   the selection module is configured to sequentially output each of the designed reference voltages from the output terminal of the selection module in the descending order of the designed reference voltages; and
   the second comparator is configured to: compare the reference voltage with any of the designed reference voltages output by the output terminal of the selection module, the designed reference voltage being used as the reference voltage; if the detection voltage is less than the detection voltage, output a first comparison signal; and if the detection voltage is greater than the detection voltage, output a second comparison signal; and the comparison result comprises all comparison signals output by the second comparator.

8. The voltage regulator according to claim 7, wherein the logic module comprises at least two output terminals, and the output terminal of each of the logic modules is electrically connected to one of the current source units to correspondingly control the current source unit to connect to or disconnect from the output terminal of the voltage regulation circuit; and
   the logic module is configured to control an output terminal of each of the logic modules to output a first control signal or a second control signal according to the comparison result, to correspondingly control a current source unit to connect to or disconnect from the output terminal of the voltage regulation circuit; and
   the control signal comprises a first control signal or a second control signal output by an output terminal of each of the logic modules.

9. The voltage regulator according to claim 8, wherein constant current output by each of the current source units is 1 to $2^N$ times the reference current in sequence, where $N \geq 1$ and N is a positive integer; and the designed current is the sum of constant current generated by the current source unit connected to the output terminal of the voltage regulation circuit.

10. A power supply system comprising a voltage regulator, wherein the voltage regulator comprising a voltage regulation circuit, a detection circuit and at least one current source unit;
    an output terminal of the voltage regulation circuit is electrically connected to a first terminal of each of the current source units, and is configured to be electrically connected to a load; and a second terminal of each of the current source units is electrically connected to a first voltage terminal; and
    the detection circuit is electrically connected to the voltage regulation circuit, and is configured to: when the voltage regulation circuit is in a light-load state, control a designed number of the current source units to connect to the output terminal of the voltage regulation circuit to output designed current, and when the voltage regulation circuit is in a heavy-load state, control each of the current source units to disconnect from the output terminal of the voltage regulation circuit,
    wherein the voltage regulation circuit comprises a first switch module, and the detection circuit comprises a second switch module;
    a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and
    a first terminal of the second switch module is electrically connected to a third voltage terminal, and a second terminal of the second switch module is used for outputting a detection voltage.

11. The power supply system according to 10, wherein the voltage regulation circuit further comprises a first resistor and a second resistor connected in series, and the detection circuit comprises a third resistor;
    a first terminal of the first resistor is electrically connected to a second terminal of the first switch module, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal; and a first terminal of the third resistor is electrically connected to a second terminal of the second switch module, a second terminal of the third resistor is electrically connected to a fifth voltage terminal, and the voltage of the fifth voltage terminal is less than a voltage of the third voltage terminal.

12. The power supply system according to 10, wherein the detection circuit comprises a control unit;
a first terminal of the control unit is electrically connected to a second terminal of the second switch module; a second terminal of the control unit is configured to obtain a reference voltage; and a third terminal of the control unit is configured to be electrically connected to the current source unit; and
the control unit is configured to: compare the reference voltage with the detection voltage, if the detection voltage is less than the reference voltage, control a designed number of the current source units to connect to the output terminal of the voltage regulation circuit to output designed current, and if the detection voltage is greater than the reference voltage, control each of the current source units to disconnect from the output terminal of the voltage regulation circuit.

13. The power supply system according to 12, wherein the control unit comprises a first comparator;
a first input terminal, a second input terminal and an output terminal of the first comparator are respectively used as the first terminal, the second terminal and the third terminal of the control unit; and
the first comparator is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit to connect to or disconnect from an output terminal of the voltage regulation circuit.

14. A receiver, comprising: a clock & data recovery circuit and a voltage regulator, wherein the voltage regulation circuit comprises a first switch module, and the detection circuit comprises a second switch module;
an output terminal of the voltage regulation circuit is electrically connected to a first terminal of each of the current source units, and is configured to be electrically connected to a load; and a second terminal of each of the current source units is electrically connected to a first voltage terminal; and
the detection circuit is electrically connected to the voltage regulation circuit, and is configured to: when the voltage regulation circuit is in a light-load state, control a designed number of the current source units to connect to the output terminal of the voltage regulation circuit to output designed current, and when the voltage regulation circuit is in a heavy-load state, control each of the current source units to disconnect from the output terminal of the voltage regulation circuit;
wherein the voltage regulation circuit comprises a first switch module, and the detection circuit comprises a second switch module;
a first terminal of the first switch module is electrically connected to a second voltage terminal, a second terminal of the first switch module is electrically connected to the output terminal of the voltage regulation circuit, and a control terminal of the first switch module is electrically connected to a control terminal of the second switch module; and
a first terminal of the second switch module is electrically connected to a third voltage terminal, and a second terminal of the second switch module is used for outputting a detection voltage.

15. The receiver according to claim 14, wherein the voltage regulation circuit further comprises a first resistor and a second resistor connected in series, and the detection circuit comprises a third resistor;
a first terminal of the first resistor is electrically connected to a second terminal of the first switch module, a second terminal of the first resistor is electrically connected to a first terminal of the second resistor, a second terminal of the second resistor is electrically connected to a fourth voltage terminal, and the voltage of the fourth voltage terminal is less than the voltage of the second voltage terminal; and
a first terminal of the third resistor is electrically connected to a second terminal of the second switch module, a second terminal of the third resistor is electrically connected to a fifth voltage terminal, and the voltage of the fifth voltage terminal is less than a voltage of the third voltage terminal.

16. The receiver according to claim 14, wherein the detection circuit comprises a control unit;
a first terminal of the control unit is electrically connected to a second terminal of the second switch module; a second terminal of the control unit is configured to obtain a reference voltage; and a third terminal of the control unit is configured to be electrically connected to the current source unit; and
the control unit is configured to: compare the reference voltage with the detection voltage, if the detection voltage is less than the reference voltage, control a designed number of the current source units to connect to the output terminal of the voltage regulation circuit to output designed current, and if the detection voltage is greater than the reference voltage, control each of the current source units to disconnect from the output terminal of the voltage regulation circuit.

17. The receiver according to claim 16, wherein the control unit comprises a first comparator;
a first input terminal, a second input terminal and an output terminal of the first comparator are respectively used as the first terminal, the second terminal and the third terminal of the control unit; and
the first comparator is configured to: compare the reference voltage with the detection voltage, if the detection voltage is less than the reference voltage, output a first comparison signal, and if the detection voltage is greater than the reference voltage, output a second comparison signal; and the first comparison signal and the second comparison signal are respectively used to control the current source unit to connect to or disconnect from an output terminal of the voltage regulation circuit.

* * * * *